United States Patent
Asada

(10) Patent No.: US 6,570,451 B2
(45) Date of Patent: May 27, 2003

(54) HIGH-FREQUENCY POWER AMPLIFIER

(75) Inventor: Tomoyuki Asada, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 16 days.

(21) Appl. No.: 09/849,261

(22) Filed: May 7, 2001

(65) Prior Publication Data

US 2002/0063602 A1 May 30, 2002

(30) Foreign Application Priority Data

Nov. 30, 2000 (JP) ........................................ 2000-365425

(51) Int. Cl.$^7$ ................................................ H03F 3/04
(52) U.S. Cl. ...................... 330/296; 330/296; 330/302; 330/307; 330/310
(58) Field of Search .............................. 330/286, 296, 330/302, 307, 310

(56) References Cited

U.S. PATENT DOCUMENTS

| | | | | | |
|---|---|---|---|---|---|
| 5,325,072 A | * | 6/1994 | Kohjiro et al. | ............. | 330/286 |
| 5,473,281 A | * | 12/1995 | Honjo | ......................... | 330/286 |
| 5,874,859 A | * | 2/1999 | Amachi et al. | ............. | 330/277 |
| 5,889,434 A | * | 3/1999 | Shimura et al. | ............ | 330/302 |
| 5,939,941 A | * | 8/1999 | Nair et al. | .................. | 330/251 |
| 5,982,236 A | * | 11/1999 | Ishikawa et al. | ............. | 330/296 |
| 6,121,841 A | * | 9/2000 | Sakuno | ........................ | 330/285 |
| 6,163,221 A | * | 12/2000 | Matsuno | ...................... | 330/302 |
| 6,211,658 B1 | | 4/2001 | Ganser et al. | | |
| 6,424,223 B1 | * | 7/2002 | Wang et al. | .................. | 330/286 |
| 6,437,649 B2 | * | 8/2002 | Miyashita et al. | .......... | 330/302 |

FOREIGN PATENT DOCUMENTS

| DE | 19916569 | 10/2000 |
|---|---|---|
| JP | 10-322145 | 12/1998 |
| JP | 11-274867 | 10/1999 |

OTHER PUBLICATIONS

"HBT MMIC Amplifier for Mobile Communications" *Mitsubishi Denki Giho*, vol. 74, No. 6, pp. 43–46 (2000).

* cited by examiner

Primary Examiner—Michael Tokar
Assistant Examiner—Khai Nguyen
(74) Attorney, Agent, or Firm—Leydig, Voit & Mayer, Ltd.

(57) ABSTRACT

A high-frequency power amplifier includes a semi-insulating GaAs substrate having disposed thereon an amplifying bipolar transistor, a bias circuit, a bias circuit output terminal connected to the bias circuit, and a base electrode connection terminal connected to the bipolar transistor; a chip inductor connected between the bias circuit output terminal and the base electrode connection terminal; and a mounting substrate on which both the semi-insulating GaAs substrate and the chip inductor are disposed, side by side.

8 Claims, 5 Drawing Sheets

HIGH-FREQUENCY POWER AMPLIFIER

BACKGROUND OF THE INVENTION

1. Field of the Invention

The present invention relates to a high-frequency power amplifier, and more particularly to an improvement in stability of a high-frequency power amplifier using a bipolar transistor.

2. Description of the Related Art

Recently, portable terminals such as portable phones have been spreading. When developing such recent models, a key point to consider is to reduce their size and weight, which requires a high-frequency power amplifier having a high output power capacity as a key component.

Heterojunction bipolar transistors (hereinafter abbreviated as "HBTs") have been used for such high-power high-frequency power amplifiers in many portable phones since they have a large current gain β and, furthermore, types (GaAs types) of those having their emitter composed of AlGaAs and their base composed of GaAs provide high speed operation.

FIG. 5 is a circuit diagram of a conventional high-frequency power amplifier.

In FIG. 5, reference numeral 100 denotes a high-frequency power amplifier; 102 a substrate; 104 an MMIC chip; 106 an HBT for high-frequency power amplification; 108 an input matching circuit for the HBT 106; 110 an output matching circuit for the HBT 106; 112 a bias circuit for controlling the base potential applied to the HBT 106; 114 an isolation resistance for the bias circuit 112; 116 a signal input terminal for high-frequency power signals; 118 a signal output terminal for high-frequency power signals; 120 an output-control input terminal; 122 and 124 power source terminals for DC voltages; and 126 a ground terminal.

High-frequency signal power fed to the signal input terminal 116 is passed through the input matching circuit 108 and amplified by the HBT 106. The amplified high-frequency signal power is then output from the signal output terminal 118 through the output matching circuit 110. At that time, the base electrode of the HBT 106 is supplied with a base current at a predetermined voltage from the bias circuit 112 controlled by a control signal fed through the output-control input terminal 120. The isolation resistance 114 is provided between the bias circuit 112 and the base electrode of the HBT 106 so as to suppress part of the signal power from leaking to the bias circuit 112 (suppressing the sneak leakage power). When leakage power flows to the bias circuit 112, the bias circuit becomes unstable, reducing the stability of the power amplifier, and as a result, an excess current may flow due to occurrence of unwanted oscillation, which may cause a reduction in the reliability of the power amplifier.

As the output power of amplifiers becomes higher, signal power input to the HBT 106 is increased, making the leakage power greater. To suppress the increase in the leakage power, it is necessary to increase the resistance value R1 of the isolation resistance 114. On the other hand, the HBT 106 requires that a base current Ib supplied to its base electrode and the base potential V2 each must have a certain required value. However, increasing the resistance value R1 of the isolation resistance 114 to suppress the leakage power reduces the potential V2 applied to the base electrode as expressed by the formula $$V2 = V1 - Ib * R1,$$

where V1 is the output voltage of the bias circuit 112, and the base current Ib is fixed.

Therefore, in some cases, it is impossible to apply the base potential V2 of a required value.

To solve this problem, an inductor having a high-impedance characteristic in a target frequency band may be formed on the MMIC chip 104 in place of the isolation resistance 114 so that it is possible to reduce the amount of signal power leaking to the bias circuit 112 without reducing the potential V2 applied to the base of the HBT 106. However, this increases the size of the MMIC chip, thereby increasing its cost.

Incidentally, the inventions disclosed in Japanese Laid-Open Patent Publications Nos. 11-274867 (1999) and 10-322145 (1998) each use an FET as an amplifier transistor, and its gate bias resistor is also formed of an FET. However, the present invention relates to a bipolar transistor and therefore has a configuration different from those of the above-disclosed inventions.

On the other hand, Mitsubishi Denki Giho VO174 (No.6) issued 2000 describes a dual-band HBT MMIC amplifier on pages 43(401) through 46 (404), but does not mention the present invention described below.

SUMMARY OF THE INVENTION

The present invention has been made to solve the above-described problems. Therefore, it is an object of the present invention to provide a high-frequency power amplifier which is highly stable and inexpensive and in which signal leakage power to the bias circuit is small.

According to one aspect of the invention, there is provided a high-frequency power amplifier comprising: a semi-insulating semiconductor substrate; a first bipolar transistor having a base electrode for receiving a signal through an input matching circuit, and a collector electrode for outputting an amplified signal to an output matching circuit, the first bipolar transistor being disposed on the semiconductor substrate; a bias circuit for supplying a base current to the first bipolar transistor, the bias circuit being disposed on the semiconductor substrate; a first terminal connected to an output end of the bias circuit and disposed on the semiconductor substrate; a second terminal connected to the base electrode of the first bipolar transistor and disposed on the semiconductor substrate; a reactance element connected between the first terminal and the second terminal; and a mounting substrate having the reactance element and the semiconductor substrate disposed thereon.

Accordingly, the present invention can reduce the amount of the signal power leaking to the bias circuit without increasing the surface area of the semiconductor substrate, ensuring a stable operation of the bias circuit, and can provide an inexpensive and highly reliable high-frequency power amplifier.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENT

First Embodiment

A fist embodiment of the present invention comprises a semi-insulating GaAs substrate having disposed thereon an amplifier bipolar transistor, a bias circuit, a bias circuit output terminal connected to the output end of the bias circuit, and a base electrode connection terminal connected to the base electrode of the amplifier bipolar transistor; a chip inductor connected between the bias circuit output terminal and the base electrode connection terminal; and a mounting substrate on which both the semi-insulating GaAs substrate and the chip inductor are disposed, side by side.

Figure 1:
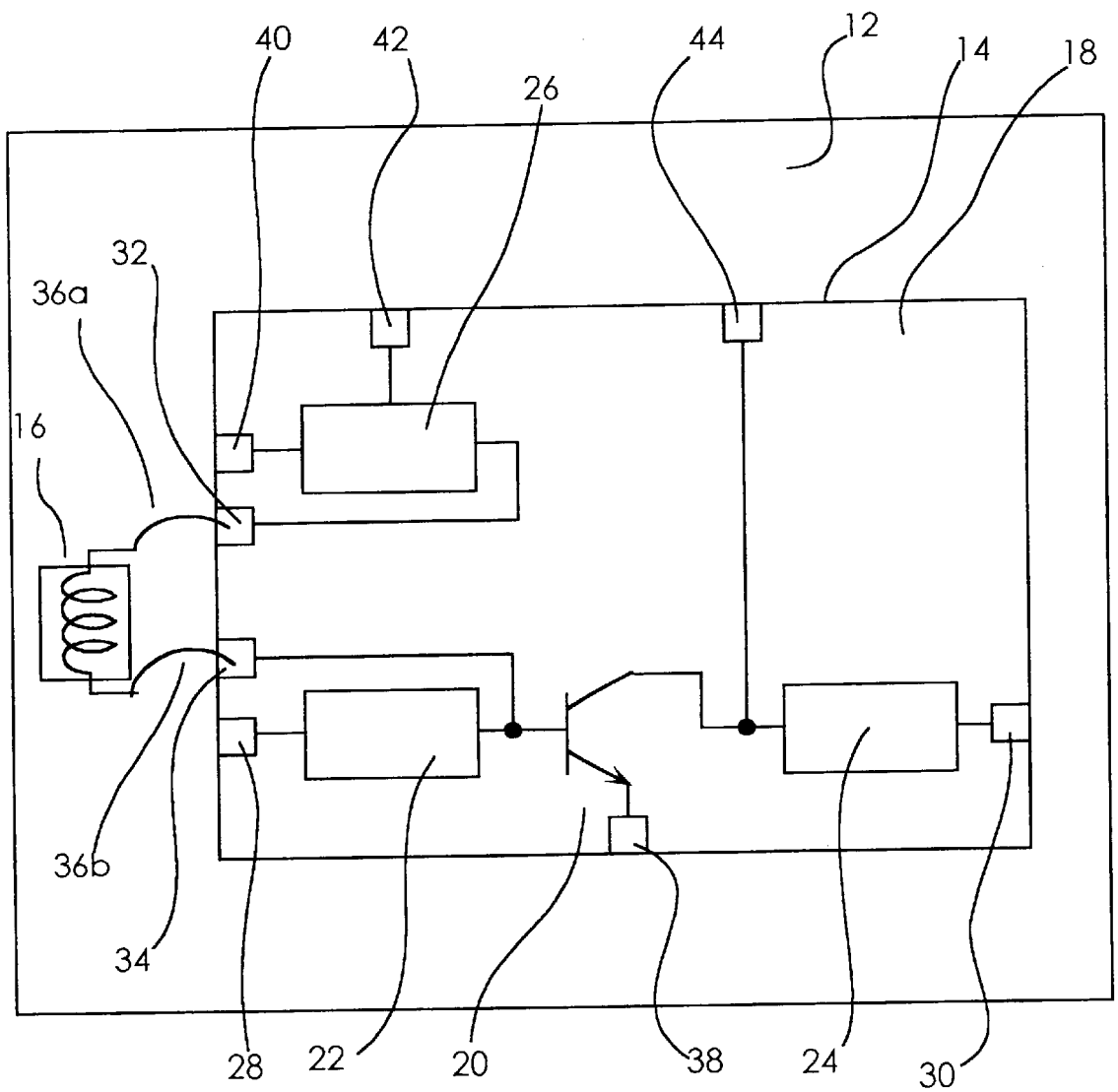
FIG. 1 is a circuit diagram of a high-frequency power amplifier in accordance with one embodiment of the invention.

FIG. 1 is a circuit diagram of a high-frequency power amplifier according to the first embodiment of the present invention.

Referring to FIG. 1, reference numeral 10 denotes a high-frequency power amplifier; 12 a mounting substrate made of ceramic or glass epoxy; 14 an MMIC chip; and 16 a chip inductor as a reactance element. The MMIC chip 14 and the chip inductor 16 are bonded onto the mounting substrate 12, side by side.

Reference numeral 18 denotes a semi-insulating GaAs substrate used as the substrate of the MMIC chip 14, while 20 denotes a GaAs-type HBT for high-frequency power amplification formed on the GaAs substrate 18 as the first bipolar transistor, having its emitter composed of AlGaAs and its base composed of GaAs.

Reference numeral 22 denotes the input matching circuit for the HBT 20 formed on the GaAs substrate 18, and is connected to the base electrode of the HBT 20. Reference numeral 24, on the other hand, denotes the output matching circuit for the HBT 20, and is connected to the collector of the HBT 20. Reference numeral 26 indicates a bias circuit for controlling the base potential applied to the HBT 20.

Figure 2:
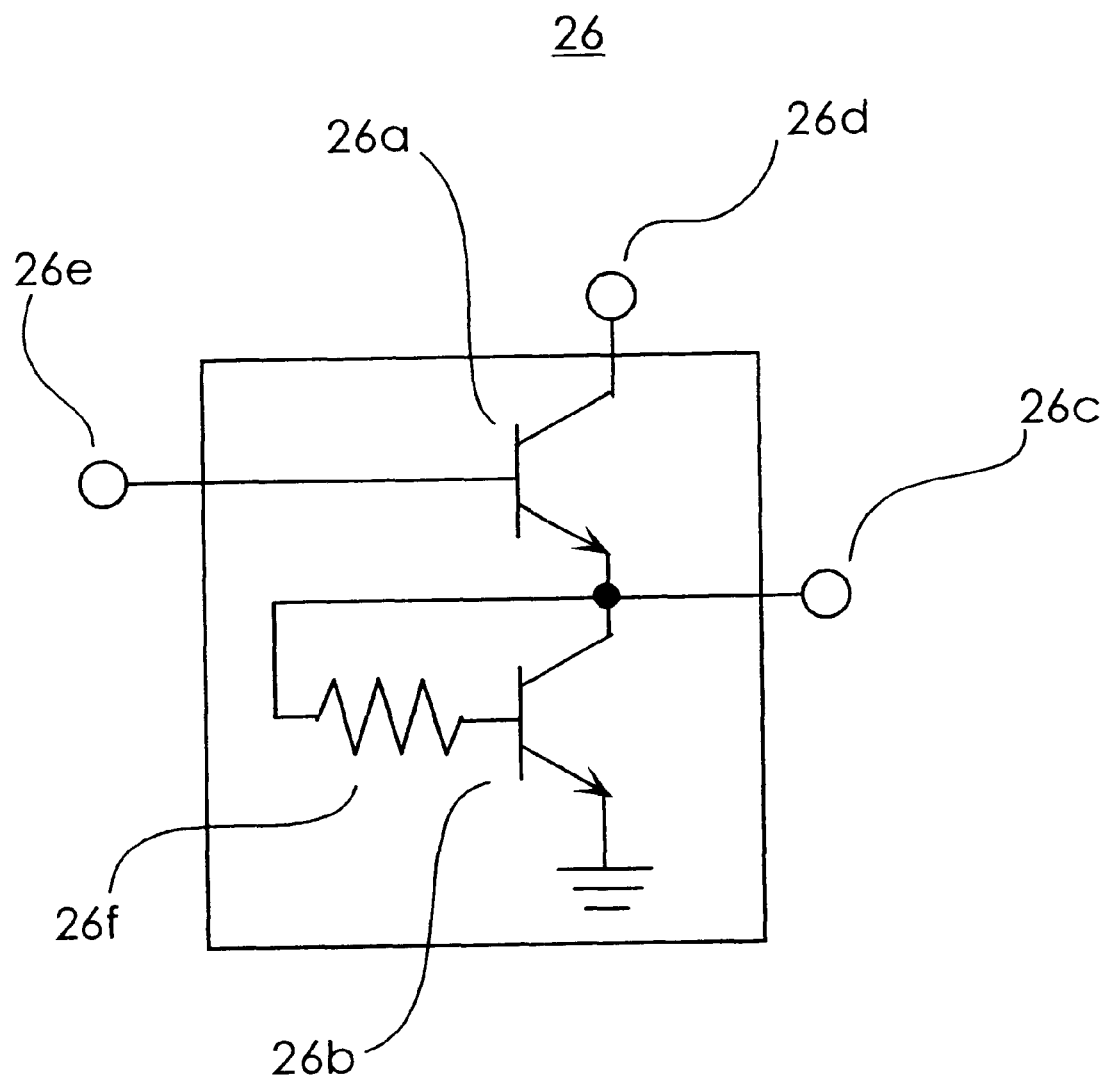
FIG. 2 is a circuit diagram of a bias circuit of a high-frequency power amplifier in accordance with one embodiment of the invention.

FIG. 2 is a circuit diagram of the bias circuit.

Referring to FIG. 2, reference numerals 26a and 26b denote bipolar transistors for determining the output voltage V1 of the output end 26c of the bias circuit by a resistive voltage division between the transistors to turn on/off the HBT 20. Reference numeral 26d denotes the power source end, 26e denotes the control end, and 26f indicates a resistance.

Referring back to FIG. 1, reference numeral 28 denotes a signal input terminal which receives high-frequency signal power and is connected to the input matching circuit 22. Reference numeral 30, on the other hand, denotes a signal output terminal which outputs high-frequency signal power, and is connected to the output matching circuit. Reference numeral 32 indicates a bias circuit output terminal (a first terminal) connected to the output end 26c of the bias circuit 26. Reference numeral 34 denotes a base electrode connection terminal (a second terminal) connected to the base electrode of the HBT 20.

Reference numerals 36a and 36b denote bonding wires. The bonding wire 36a connects one end of the chip inductor 16 and the bias circuit output terminal 32, while the bonding wire 36b connects the other end of the chip inductor 16 and the base electrode connection terminal 34.

Reference numeral 38 indicates a ground terminal connected to the emitter electrode of the HBT 20. Reference numeral 40 denotes an output-control input terminal which is connected to the control end 26e of the bias circuit 26, and receives a control signal for adjusting the level of a base current supplied to the HBT 20, and controlling the on/off states of the HBT 20. Reference numerals 42 and 44 denote power source terminals each receiving a DC voltage Vc, and the power source terminal 42 is connected to the power source end 26d of the bias circuit 26.

The power source terminal 44, on the other hand, is connected to the collector electrode of the HBT 20 so as to apply a collector bias to the HBT 20.

High-frequency signal power fed to the signal input terminal 28 and passed through the input matching circuit 22 is amplified by the HBT 20 and then output from the signal output terminal 30 through the output matching circuit 24. At that time, a base current controlled by a control signal fed to the output-control input terminal 40 is supplied from the bias circuit 26 to the HBT 20 at a predetermined potential.

This base current is supplied from the output end of the bias circuit 26 to the bias circuit output terminal 32, and subsequently flows from the bias circuit output terminal 32 to one end of the chip inductor 16 through the bonding wire 36a. The base current output from the other end of the chip inductor 16 is supplied to the base electrode connection terminal 34 through the bonding wire 36b, and then fed to the base electrode of the HBT 20 through the connection path provided between the base electrode connection terminal 34 and the base electrode of the HBT 20.

The above-described route through which the base current flows includes no isolation resistance for suppressing the input signal leakage power. The chip inductor 16 is included instead. The chip inductor 16 can be designed to have a high-impedance characteristic in a target high-frequency band, and therefore can suppress the input signal power from leaking to the bias circuit 26 even when the frequency of the high-frequency input signal power becomes high, or the input signal power becomes large. Furthermore, the chip inductor 16 does not reduce the base potential applied to the base electrode of the HBT 20.

Since the chip inductor 16 is disposed on the mounting substrate, side by side with the MMIC chip 14 instead of being mounted on the GaAs substrate 18, it is not necessary to increase the size of the GaAs substrate 18 to accommodate the chip inductor 16 regardless of the footprint size of the chip inductor 16.

For example, the GaAs substrate of a conventional MMIC chip using an isolation resistance has a surface area of 0.8 mm$^2$. And the GaAs substrate 18 of the MMIC chip 14 of the first embodiment in which the chip inductor 16 is mounted on the mounting substrate 12, side by side with the MMIC chip 14 also has the same surface area 0.8 mm$^2$.

Suppose that a spiral inductor is formed on the MMIC chip. The necessary surface area on the MMIC chip for accommodating the spiral inductor is determined as follows.

For example, the frequency of the input signal is assumed to be 1 GHz considering that the high-frequency power amplifier is used for portable phones. Assuming that the value of impedance necessary to separate the HBT 20 from the bias transistors 26a and 26b of the bias circuit 26 in the high frequency region is 30 Ω, an inductance value of 30 nH (nanohenrys) is required.

If a spiral inductor is used to provide this inductance value, the GaAs substrate of the MMIC chip must have a surface area of 2.5 mm$^2$, which is about three times as large as the surface area required for the GaAs substrate 18 of the MMIC chip 14 when the chip inductor 16 is mounted on the mounting substrate 12.

As described above, the first embodiment is capable of effectively reducing the amount of high-frequency signal power leaking to a bias circuit without increasing the substrate area of the expensive GaAs substrate of an MMIC chip, ensuring a stable operation of the bias circuit. Furthermore, since the chip inductor employed is mounted on the mounting substrate, side by side with the MMIC chip, the substrate area of the expensive GaAs substrate of the MMIC chip need not be increased to accommodate the chip inductor, resulting in a low-cost high-frequency power amplifier. Thus, the first embodiment can provide a high-frequency power amplifier which is inexpensive and highly reliable, and highly stable since its bias circuit is stable.

Particularly, use of a chip inductor makes it possible to easily optimize the characteristics of the high-frequency power amplifier since the inductance value is easily adjusted by replacing one inductor with another. Furthermore, it is possible to reduce the mounting area on the mounting substrate, and therefore the first embodiment is suitably used for the purpose of miniaturization of devices.

A Variation of the First Embodiment

Figure 3:
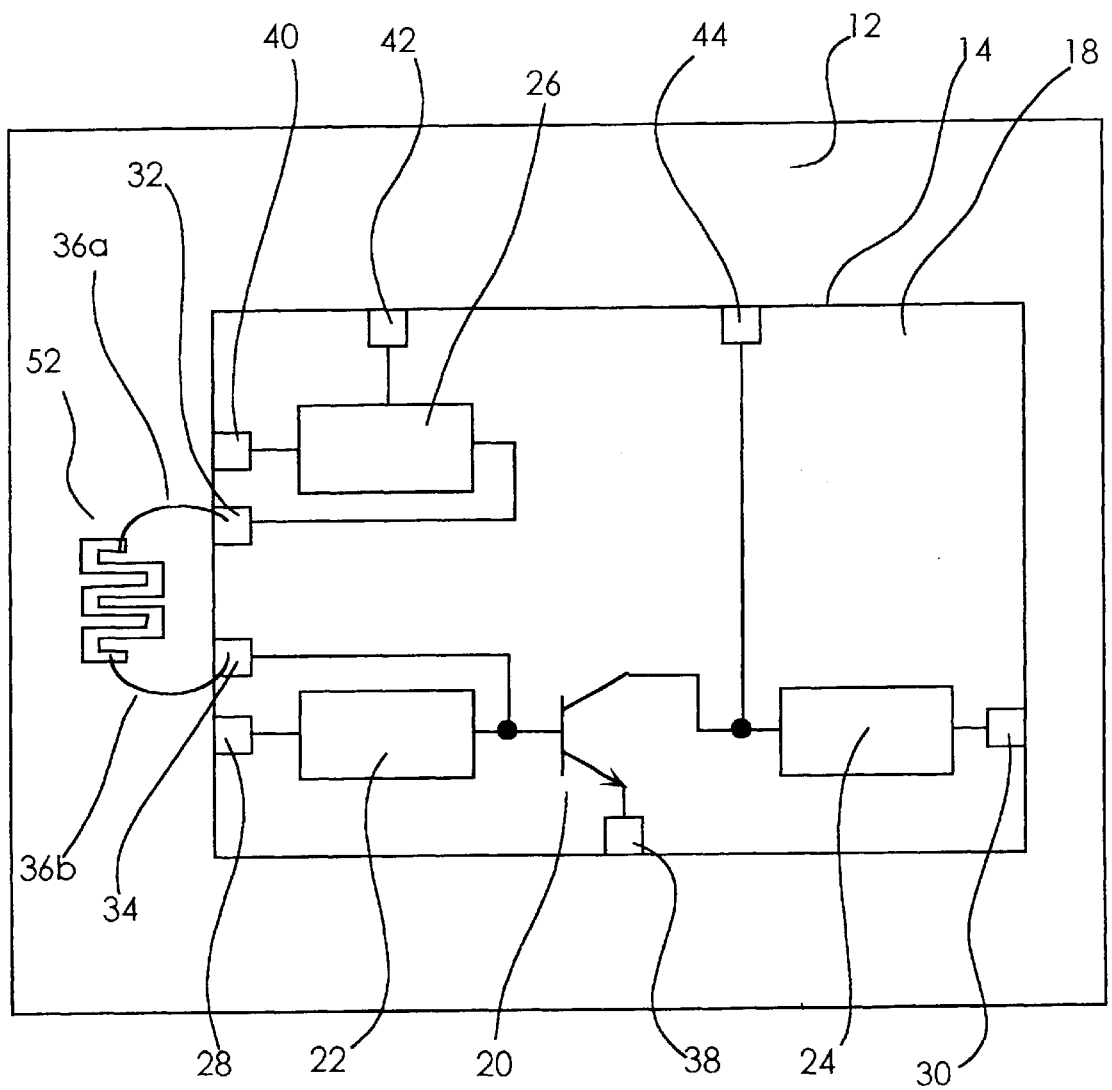
FIG. 3 is a circuit diagram of another high-frequency power amplifier in accordance with one embodiment of the invention.

FIG. 3 is a circuit diagram of a high-frequency power amplifier according to a variation of the first embodiment. This variation uses a microstrip line instead of the chip inductor 16 in above high-frequency power amplifier 10.

Referring to FIG. 3, reference numeral 50 denotes a high-frequency power amplifier, and 52 denotes a microstrip line as a reactance element.

The high-frequency power amplifier 50 of this variation operates in the same way as does the high-frequency power amplifier 10, making it possible to reduce the amount of high-frequency signal power leaking to a bias circuit without increasing the surface area of the expensive GaAs substrate of the MMIC chip. Accordingly, this variation can also provide a high-frequency power amplifier which is inexpensive and highly reliable since its bias circuit stably operates.

Particularly, since this variation uses a microstrip line instead of a chip inductor as a reactance element, its pattern can be formed on the mounting substrate 12, reducing the parts count.

Second Embodiment

A high-frequency power amplifier according to a second embodiment of the present invention has a multistage configuration in which a chip inductor is connected between the bias circuit and the base electrode of the amplifier bipolar transistor in the latter stage to prevent signal power from leaking to the bias circuit. Furthermore, the chip inductor and a semi-insulating semiconductor substrate on which the former-stage power amplifier, the latter-stage bipolar transistor, and the bias circuits are disposed, are mounted on a mounting substrate, side by side.

Figure 4:
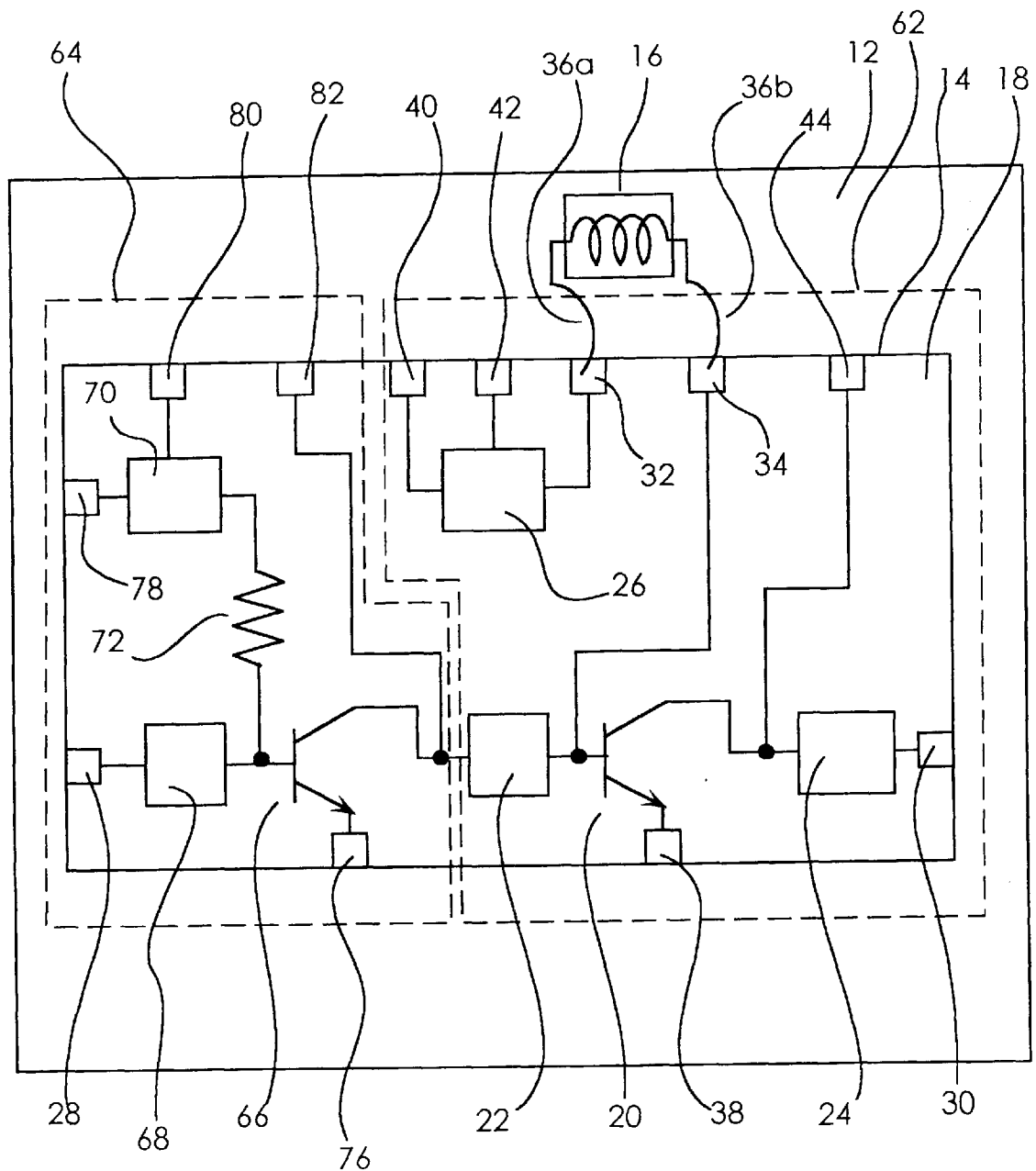
FIG. 4 is a circuit diagram of a multistage high-frequency power amplifier in accordance with another embodiment of the invention.
Figure 5:
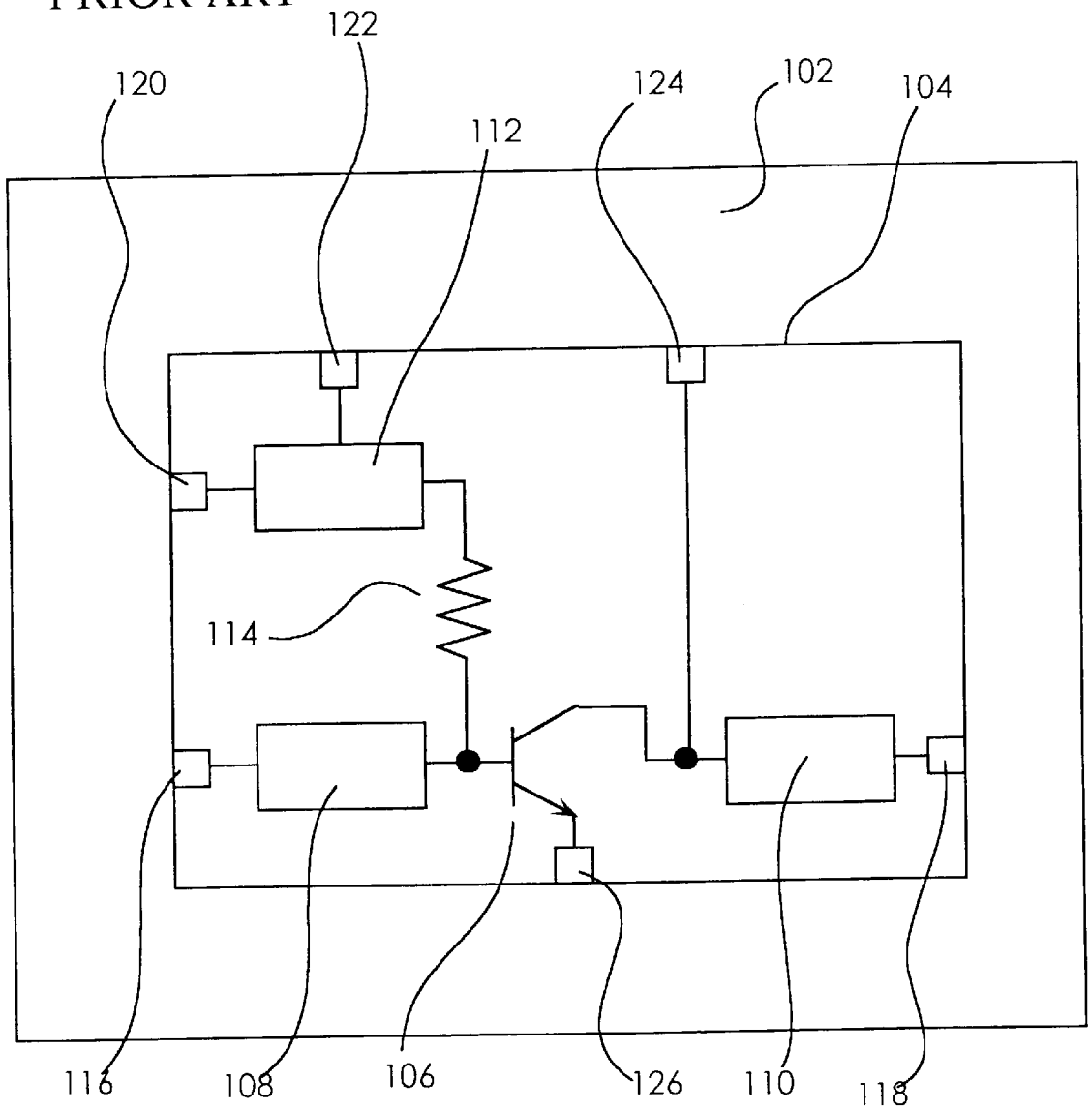
FIG. 5 is a circuit diagram of a conventional high-frequency power amplifier.

FIG. 4 is a circuit diagram of a multistage high-frequency power amplifier according to the present invention.

Referring to FIG. 4, reference numeral 60 denotes a high-frequency power amplifier, and 62 denotes the latter stage of the amplifier, which is enclosed by a broken line in the figure. This amplifier latter stage 62 corresponds to the high-frequency power amplifier 10 of the first embodiment. The components in the amplifier latter stage 62 corresponding to those in the high-frequency power amplifier 10 are denoted by like numerals. Reference numeral 64 denotes the newly added amplifier former stage in the high-frequency power amplifier 60. This amplifier former stage 64 is also enclosed by a broken line in the figure.

Reference numeral 66 denotes the amplifier HBT in the amplifier former stage 64; 68 the input matching circuit for the former-stage HBT 66; 70 the bias circuit for the HBT 66; 72 an isolation resistance provided between the HBT 66 and the bias circuit 70 in the amplifier former stage 64 to prevent leaking of input signal power; 76 a ground terminal connected to the emitter electrode of the HBT 66; 78 the control input terminal of the bias circuit 70; and 80 and 82 power source terminals to which a DC voltage Vc is applied.

High-frequency input signal power fed from the signal input terminal 28 is first amplified by the amplifier former stage 64. Since the input signal power input to the HBT 66 in the amplifier former stage 64 is small and therefore a small base current is enough for the HBT 66, the isolation resistance 72 can be used to prevent the input signal power from leaking to the bias circuit 70 without any problems. The input signal power amplified by the amplifier former stage 64 is supplied to the HBT 20 in the amplifier latter stage 62 through the matching circuit 22.

At that time, the input signal power supplied to the HBT 20 is already large, and therefore its leakage power to the bias circuit 26 is also large. On the other hand, it is necessary to increase the base current so as to prevent production of a voltage drop. However, if the value of the isolation resistance is increased to suppress the leakage power, it is not possible to obtain a base potential large enough to drive the HBT 20.

To solve the above problem, in the high-frequency power amplifier 60, a base current to be supplied to the amplifier HBT 20 in the amplifier latter stage 62 is first output from the output end of the bias circuit 26 to the bias circuit output terminal 32, and then flows from the bias circuit output terminal 32 to one end of the chip inductor 16 through the bonding wire 36*a*. The base current output from the other end of the chip inductor 16 is supplied to the base electrode connection terminal 34 through the bonding wire 36*b*, and then fed to the base electrode of the HBT 20 through the connection path provided between the base electrode connection terminal 34 and the base electrode of the HBT 20.

The chip inductor 16 can be designed to have a high-impedance characteristic in a target high-frequency band, and therefore can suppress input signal power from leaking to the bias circuit 26 even when the input signal power input to the amplifier HBT 20 in the amplifier latter stage 62 becomes large, or the frequency of the input signal becomes high. Furthermore, the chip inductor 16 does not reduce the base potential applied to the base electrode of the HBT 20.

Since the chip inductor 16 is disposed on the mounting substrate, side by side with the MMIC chip 14 instead of being mounted on the GaAs substrate 18, it is not necessary to increase the size of the GaAs substrate 18 to accommodate the chip inductor 16 regardless of the footprint size of the chip inductor 16.

As can be seen from the above description, in a multistage high-frequency power amplifier, the present invention can be applied to not only the output stage but also latter stages of the power amplifier in which signal power is large, so as to effectively suppress the signal power from leaking to the bias circuit. Thus, the second embodiment is capable of reducing the amount of high-frequency signal power leaking to a bias circuit without increasing the substrate area of the expensive GaAs substrate of an MMIC chip, ensuring a stable operation of the bias circuit and the stability of the power amplifier. That is, the second embodiment can provide a multistage high-frequency power amplifier which is inexpensive and highly stable and reliable.

The present invention provides high-frequency power amplifiers having configurations as described above, producing the following effects.

A high-frequency power amplifier according to the present invention comprises: a semi-insulating semiconductor substrate; a first bipolar transistor having a base electrode for receiving a signal through an input matching circuit, and a collector electrode for outputting an amplified signal to an output matching circuit, the first bipolar transistor being disposed on the semiconductor substrate; a bias circuit for supplying a base current to the first bipolar transistor, the bias circuit being disposed on the semiconductor substrate; a first terminal connected to an output end of the bias circuit and disposed on the semiconductor substrate; a second terminal connected to the base electrode of the first bipolar transistor and disposed on the semiconductor substrate; a reactance element connected between the first terminal and the second terminal; and a mounting substrate having the reactance element and the semiconductor substrate disposed thereon; whereby the present invention can reduce the amount of the signal power leaking to the bias circuit without increasing the surface area of the semiconductor substrate, ensuring a stable operation of the bias circuit. Thus, the present invention can provide an inexpensive and highly reliable high-frequency power amplifier.

In another aspect (as a multistage high-frequency power amplifier), the high-frequency power amplifier further comprises a second bipolar transistor for outputting an amplified output signal to the input matching circuit of the first bipolar transistor; whereby the present invention can reduce the amount of the signal power leaking to the bias circuit for the first bipolar transistor in the latter stage of the multistage amplifier without increasing the surface area of the semiconductor substrate, ensuring a stable operation of the bias circuit for the first bipolar transistor in the latter stage. Thus, the present invention can provide an inexpensive and highly reliable multistage high-frequency power amplifier.

In still another aspect, the high-frequency power amplifier includes a chip inductor as the above reactance element, whereby the inductance value can be easily adjusted by replacing one inductor with another, and furthermore the mounting area can be reduced, realizing a small and highly reliable high-frequency power amplifier.

In yet another aspect, the high-frequency power amplifier includes a microstrip line as the above reactance element, whereby since its pattern can be formed on the mounting substrate, the parts count can be reduced, realizing a low-cost high-frequency power amplifier.

While the presently preferred embodiments of the present invention have been shown and described. It is to be understood these disclosures are for the purpose of illustration and that various changes and modifications may be made without departing from the scope of the invention as set forth in the appended claims.

The entire disclosure of a Japanese Patent Application No. 2000-365425, filed on Nov. 30, 2000 including specification, claims, drawings and summary, on which the Convention priority of the present application is based, are incorporated herein by reference in its entirety.

What is claimed is:

1. A high-frequency power amplifier comprising:
   a semi-insulating compound semiconductor substrate;
   a first heterojunction bipolar transistor having a base electrode for receiving a signal and a collector electrode for outputting an amplified signal, said first heterojunction bipolar transistor being disposed on said semi-insulating compound semiconductor substrate;
   an input matching circuit connected to said base electrode for supplying a signal to said first heterojunction bipolar transistor, said input matching circuit being disposed on said semi-insulating compound semiconductor substrate;
   an output matching circuit connected to said collector electrode for outputting the amplified signal from said first heterojunction bipolar transistor, said output matching circuit being disposed on said semi-insulating compound semiconductor substrate;
   a bias circuit for supplying a base current to said first heterojunction bipolar transistor, said bias circuit being disposed on said semi-insulating compound semiconductor substrate;
   a first terminal connected to an output end of said bias circuit and disposed on said semi-insulating compound semiconductor substrate;
   a second terminal connected to said base electrode of said first heterojunction bipolar transistor and disposed on said semi-insulating compound semiconductor substrate;
   a dielectric mounting substrate to which said semi-insulating compound semiconductor substrate is bonded; and
   a reactance element on said dielectric mounting substrate and connected to said first terminal and said second terminal.

2. The high-frequency power amplifier according to claim 1, wherein said reactance element is a chip inductor bonded to said dielectric mounting substrate next to said semi-insulating compound semiconductor substrate.

3. The high-frequency power amplifier according to claim 1, wherein said reactance element is a microstrip line disposed on said dielectric mounting substrate.

4. The high-frequency power amplifier according to claim 1, wherein said dielectric mounting substrate is a material selected from the group consisting of ceramics and glass epoxy.

5. The high-frequency power amplifier according to claim 1, further comprising a second heterojunction bipolar transistor for outputting an amplified output signal to said input matching circuit.

6. The high-frequency power amplifier according to claim 5, wherein said reactance element is a chip inductor bonded to said dielectric mounting substrate next to said semi-insulating compound semiconductor substrate.

7. The high-frequency power amplifier according to claim 5, wherein said reactance element is a microstrip line disposed on said dielectric mounting substrate.

8. The high-frequency power amplifier according to claim 5, including a resistance and a second bias circuit for supplying a base current to said second heterojunction bipolar transistor through said resistance, said second bias circuit and said resistance being disposed on said semi-insulating compound semiconductor substrate.

* * * * *